United States Patent [19]

Fried et al.

[11] Patent Number: 4,792,768

[45] Date of Patent: Dec. 20, 1988

[54] FAST FREQUENCY SETTLING SIGNAL GENERATOR UTILIZING A FREQUENCY LOCKED-LOOP

[75] Inventors: Raymond L. Fried, Liberty Lake; David M. Hoover, Otis Orchards, both of Wash.

[73] Assignee: Hewlett-Packard Company, Palo Alto, Calif.

[21] Appl. No.: 118,118

[22] Filed: Nov. 6, 1987

[51] Int. Cl.$^4$ .............................................. H03L 7/00
[52] U.S. Cl. ........................................ 331/11; 331/16; 331/25
[58] Field of Search .................... 331/1 A, 10, 11, 16, 331/17, 18, 25; 455/113, 120; 307/529

[56] References Cited

U.S. PATENT DOCUMENTS 3,928,813 12/1975 Kingsford-Smith ................ 331/1 A
4,568,888 2/1986 Kimura et al. ....................... 331/10

Primary Examiner—Eugene R. LaRoche
Assistant Examiner—Robert J. Pascal
Attorney, Agent, or Firm—Leslie G. Murray

[57] ABSTRACT

Signal generating apparatus including a phase-locked loop (PLL) utilizing a voltage-controlled oscillator (VCO) and a frequency-locked loop (FLL) to generate an output signal whose frequency jumps from one value to another in a selectable sequence. The signal generator further includes a delay line discriminator to provide an error signal to compensate for FM noise in the VCO. The frequency-locked loop is implemented by utilizing the FM error signal from the delay line discriminator to stabilize the center frequency of the VCO. The inherent wide bandwidth of the FLL provides a fast settling time when the loop is switched to a new frequency. In a learn mode, the gain parameters of the loop are determined and stored each of a plurality of frequencies. The gain parameters and a corresponding pretune signal for each selected frequencies are the applied to the FLL in a selectable sequence to provide a fast-switching signal generator.

5 Claims, 2 Drawing Sheets

FAST FREQUENCY SETTLING SIGNAL GENERATOR UTILIZING A FREQUENCY LOCKED-LOOP

BACKGROUND OF THE INVENTION

The present invention relates generally to signal generators, and, more particularly, to a signal generator utilizing a frequency locked-loop having very fast frequency switching times to provide an output signal which switches from frequency to frequency in a selectable sequence.

Signal generators utilizing phase-locked-loop apparatus to provide an output signal having a precise, stable frequency are well known in the art. Such a phase-locked-loop (PLL) includes a tunable oscillator, typically a voltage controlled oscillator (VCO) whose output is locked to a known reference signal by means of a phase comparator. The phase comparator generates an output voltage or current that is proportional to the phase difference between the two signals. The phase comparator output is fed back to the input of the VCO to tune the VCO to the desired frequency. This forces the VCO output signal to have the same frequency as the reference signal. By interposing a divide-by-N block in the circuit comparator, the reference frequency may instead be compared with the VCO output frequency divided by N; the VCO output will then be locked to N times the reference frequency. Another technique, called fractional-N, makes it possible to generate frequencies that are any rational multiple of the reference frequency. Such a technique is disclosed in U.S. Pat. No. 3,928,813 issued to Charles A. Kingsford-Smith on Dec. 23, 1975 entitle "Device for Synthesizing Frequencies Which are Rational Multiples of a Fundamental Frequency".

In some applications, it is often desired to generate an output signal whose frequency shifts or hops from one frequency value to another frequency value at selected intervals of time. In such applications, it is desireable for the apparatus to stabilize at the new frequency in as short a time as possible; i.e., a low settling time. U.S. Pat. No. 4,568,888 entitled "PLL Fast Frequency Synthesizer With Memories for Coarse Tuning and Loop Gain Correction" issued to Robert K. Kimura on Feb. 4, 1986 discloses a signal synthesizer employing a phase-locked loop that provides an output signal whose frequency may be selectively changed from one value to another having a reduced settling time and a substantially uniform loop gain over its entire frequency range. To achieve a low settling time at each new frequency, the frequency synthesizer includes coarse tuning means for immediately applying to the VCO a signal level having a selected value that coarsely adjusts the VCO to the new desired frequency. This coarse tuning means, includes memory means for storing information indicating the nominal signal value required by the VCO to produce each frequency in the predetermined frequency range. The coarse tuning information may be adjusted to reflect any changes in the VCO's gain frequency constant over time and temperature.

SUMMARY OF THE INVENTION

According to the principles of the present invention, apparatus that provide an output signal whose frequency may be selectably switched from one value to another with low settling time in a selectable sequence is provided. Such apparatus comprises a frequency synthesizer utilizing a fractional-N phase-locked loop (PLL) and a frequency-locked loop (FLL). A PLL includes a voltage controlled oscillator (VCO), fractional-N means for periodically changing the rational number by which the VCO signal is frequency divided, a phase detector for comparing the phase of the divided output signal with the phase of a predetermined reference signal and for producing an error signal representing the detected phase difference and a loop filter for suitably processing the phase detector signal to produce an error signal for controllably adjusting the VCO frequency. The PLL further includes a delay line discriminator which provides a FM noise error signal which is fed back to the VCO to reduce the FM noise of the output signal. The PLL further includes gain compensation means to compensate for any frequency sensitivity in the various elements and thereby achieve a substantially uniform loop gain over the entire frequency range of the VCO. The FLL comprises the VCO with the delay line discriminator providing a frequency error signal to stabilize the center frequency of the VCO.

The FLL is utilized to provide a fast switching or "hopping" output signal. The delay line discriminator measures the frequency error of the VCO output signal and provides a feed back signal to stabilize the center frequency of the VCO. The FLL has a bandwidth several megahertz (mHz) wide which provides a low settling time when the frequency is switched. The fast hop output signal is not coherently synthesized but is the output signal of the frequency stabilized VCO. To set the FLL at a desired frequency, the proper tune voltages are applied to the VCO tune line. The proper tune voltages for each desired frequency in a fast hop sequence are first learned in a learn mode and then stored in a fast hop RAM.

In the learning mode, the FLL is frequency locked to a phase-locked RF signal. The synthesized RF output signal from the VCO provides a stable frequency for the calibration of the FLL. When the FLL is locked up at a desired frequency, the voltages on the FLL tune lines are measured and saved as digital-to-analog convertor (DAC) settings in a fast hop RAM memory in the VCO controller. Three DACs are utilized to recreate the tune line voltages measured during the learn mode: pretune DAC, PLL DAC and FLL DAC. A set of voltages is measured and stored for each frequency which will be later switched to in the output signal sequence. The control signals provided by these DACs tune the FLL to reset the frequency of the VCO to within an acceptable small error of the original synthesized frequency. By addressing the data stored in the fast hop RAM, the VCO will hop from one non-coherently synthesized frequency to the next in a selectable sequence which is identical to the addressing sequence.

In this manner the FLL is utilized to first learn and store the parameters that determine the frequency of the FLL. Second, when commanded, the parameters are reapplied to the FLL to generate an output signal whose frequency hops from one value to another. The desired frequencies and sequence of hopping may be set by front panel controls. The hop sequence may also be entered real time by the user via a back panel input port. By using an FLL a significant reduction in cost and complexity as compared to any other frequency synthesis means having comparable switching times is achieved. The loop gain characteristics of a FLL provide much faster settling times than a PLL. Further, a FLL utilizing a delay line discriminator provides much better phase noise and spurious signal performance than other frequency synthesis means having comparable switching times.

DETAILED DESCRIPTION OF THE PREFERRED EMBODIMENT

Figure 1:
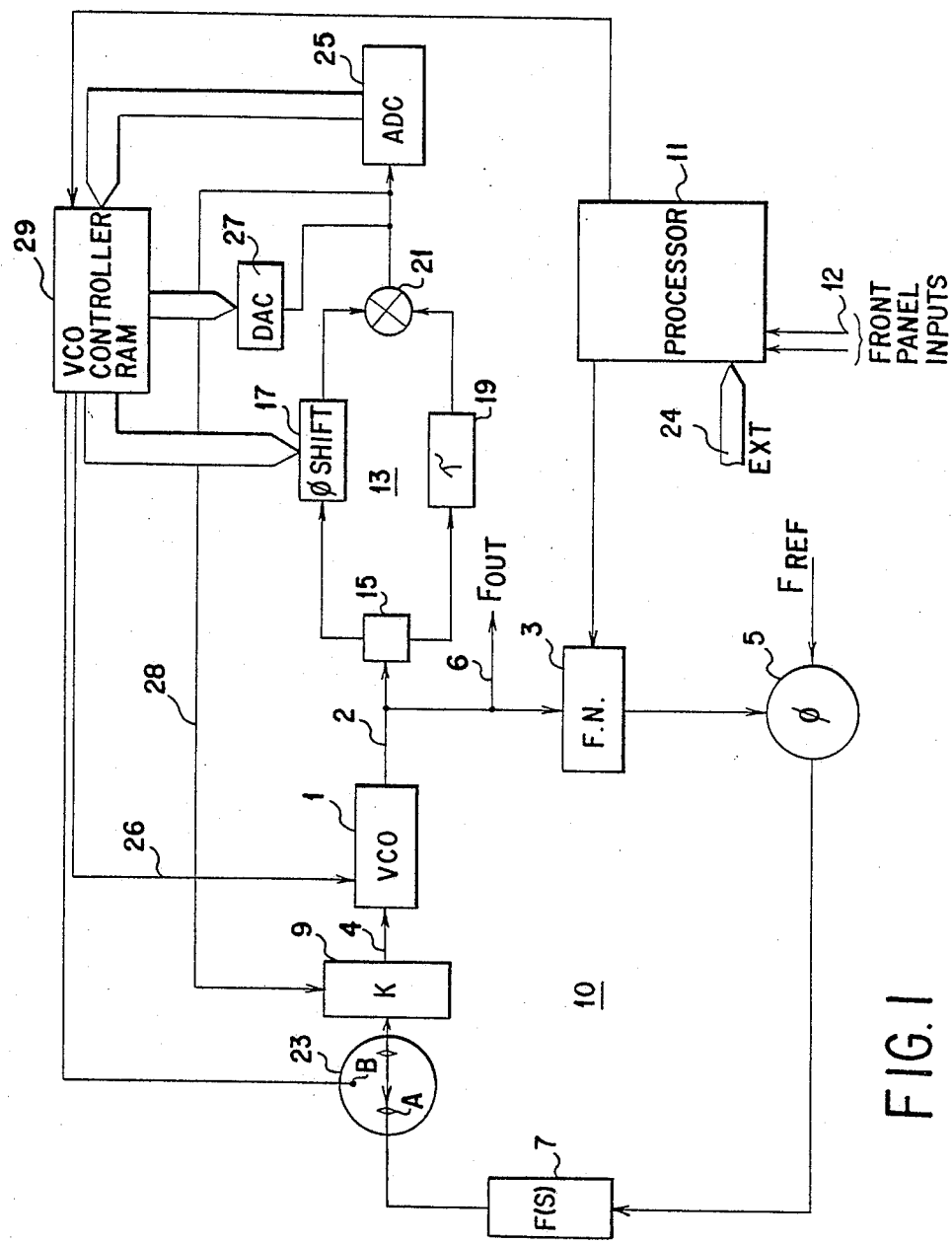
FIG. 1 is a simplified block diagram of a frequency synthesizer according to the principles of the present invention.

Referring now to the drawings, and particularly to FIG. 1, a frequency synthesizer adapted to provide an output signal whose frequency hops from one value to another in a selectable sequence is shown. The particular frequency hop sequence is selected in accordance with parameters entered through front panel inputs 12 or through an external back panel input port 24 to the processor 11. The frequency synthesizer comprises a phase-locked loop 10 (PLL) including a voltage controlled oscillator (VCO) 1 for providing an output signal Fout on line 2 in accordance with a control signal applied to the VCO 1 on line 4. The output of the VCO 1 is frequency divided by fractional-N means 3 to provide an input signal to the phase detector 5 having a frequency equal to the VCO output frequency divided by a selectable rational number. Phase detector 5 compares the phase of a predetermined reference signal with the phase of the frequency divided VCO output signal and produces an error signal having a value which is proportional to the phase difference between the two signals input to the phase detector 5. This error signal is filtered in the loop filter 7 and then coupled via switching means 23 to the loop gain compensation circuitry 9. The gain of the PLL loop components, particulary the VCO, is frequency sensitive. It is desirable for the entire PLL to have a uniform loop gain over the frequency range of the VCO. The loop gain compensation circuitry 9 provides a control signal to the VCO for selectively controlling the VCO output frequency having a constant predetermined sensitivity over the full VCO frequency range.

Figure 2:
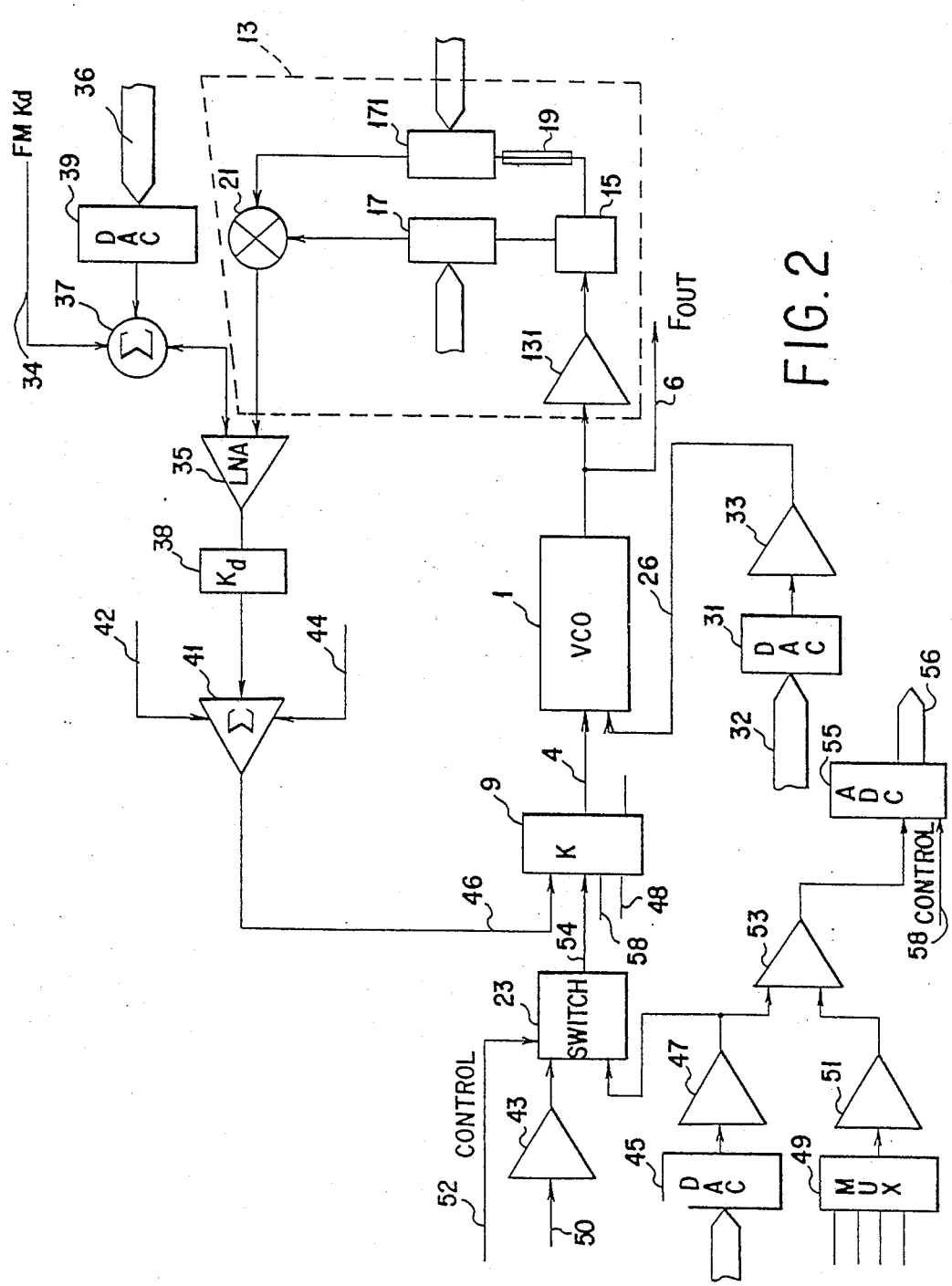
FIG. 2 is a detailed functional block diagram of the frequency-locked loop of the frequency synthesizer shown in FIG. 1.

The frequency synthesizer further includes a delay line discriminator 13 which measures FM noise of the VCO 1 output signal and feeds back an error signal to minimize the VCO 1 phase noise. The delay line discriminator 13 comprises a power amplifier 131 (as shown in FIG. 2) driving a power splitter 15. One signal from the power splitter 15 is coupled to mixer 21 via a coaxial delay line 19 having a constant delay TAU. The other signal from the power splitter 15 is coupled to a variable phase shift network 17. The outputs from the coaxial delay line 19 and the variable phase shift network 17 are coupled to the input parts of mixer 21. The delay introduced by the variable phase shift network 17 is adjusted to provide a mixer 2! output voltage of zero volts (quadrature) at the desired frequency. If the frequency of the signal at the input of the power amplifier 131 changes the coaxial delay line 19 changes the phase relationship between the two signals at the mixer 21 input ports causing the mixer 21 output to be other than zero volts providing a voltage proportional to the difference between the frequency of the VCO output signal and the desired frequency. This difference signal is then coupled back to the loop gain compensation circuitry 9 on line 28 to become part of the VCO control signal on line 4 to clean up the phase noise of the VCO output signal.

The VCO has a frequency range from 515 mHz to 1030 mHz providing an output signal having frequency selectable over a full octave. Because the tune line path of the VCO 1 can only tune the VCO 1 over a range of slightly more than 10 mHz, a pretune signal is necessary to initially set the VCO frequency. FM compensation values (Kv) for the VCO 1 at each mHz step from 505 to 1040 mHz are determined and saved in the VCO controller RAM 29. FM compensation sets the out of band FM accuracy and sets the proper FM gain sensitivity for the PLL and FLL tune lines. The discriminator gain compensation values (Kd) are also determined for each one mHz step from 505 to 1040 mHz and saved in the VCO controller RAM 29.

In all modes of operation except the fast hop mode the frequency synthesizer output signal, $F_{out}$, on line 6 is synthesized by the PLL 10. To provide an output signal $F_{out}$ on line 6 whose frequency switches are hopped from one value to another, switch means 23 switches the input of the loop gain compensation circuitry 9 from terminal A to terminal B to open the PLL 10 and set up the FLL. The FLL comprises a free running VCO 1 delay line discriminator 13, the loop gain compensation circuitry 9 and switching means 23. Since the delay line discriminator 13 measures frequency error of an RF signal, the error signal derived from the delay discriminator can be used to stabilize the center frequency of the VCO 1 thus establishing a locked frequency. The inherent wide bandwidth of the FLL provides a very short settling time when the FLL is switched from frequency to frequency.

Referring now also to FIG. 2, a detailed functional block diagram of the FLL is shown. The VCO 1 is a negative resistance oscillator utilizing four varactors in the tank circuit (not shown). The VCO 1 is shielded from other RF circuits and to reduce cavity resonances that effect the gain sensitivity of the oscillator. The VCO 1 has an output frequency range from approximately 500 to 1050 mHz. The gain sensitivity of the VCO tuning varies from 12 to 45 mHz/volt over the VCO 1 frequency range. The loop gain compensation circuitry 9 attenuates this sensitivity to a constant 9.9 mHz/volt over the VCO 1 frequency range. As the VCO 1 can only be tuned over a range of approximately 10 mHz by the control voltage on the tune line 4, it is necessary to pretune the VCO when switching to a new frequency.

Pretuned values for each mHz step of the VCO 1 frequency range are stored as digital signals in the VCO controller RAM 29. The desired digital pretune signal is input to the pretune DAC 31 on line 32. The pretune DAC 31 is a 12 bit DAC which provides an analog current signal proportional to the desired digital pretune signal applied to DAC 31. The current output of the DAC 31 is coupled to a high speed low settling time amplifier 33 which converts the current signal to a voltage signal. The pretune voltage signal is then coupled directly to the VCO tank circuit on line 26. When in the fas hop mode a pretune trigger command is sent at the same time as the digital pretune data. The pretune trigger bypasses the pretune low pass resistor (not shown) which speeds up the pretune circuitry to allow high speed pretune changes to be applied to the VCO 1. The pretune digital bits typically have a value of 324 corresponding to 515 mHz and 3200 corresponding to a frequency of 1030 mHz.

The output of VCO 1 is coupled to a power splitter (not shown) that couples equal RF levels to the output circuitry on line 6 and to the modulator amplifier and power amplifier 131. The power splitter comprises two resistors (not shown) of equal value. The power amplifier 131 insures that the input to the RF splitter 15 is a minimum of 29 dBm. The power amplifier 131 includes a "backmatch" resistor (not shown) at its output to keep the standing wave ratio of the delay line discriminator 13 within acceptable levels. The RF splitter 15 at the output of the power amplifier 131 comprises a 4-trace Lange coupler having a input impedance of 50 ohms and a −1, −7 split. The uneven split is to compensate for the loss of the coaxial delay line 19 and thereby provide two equal RF power levels to the mixer 21.

One output of the RF splitter 15, is coupled to coaxial delay line 19 and an adjustable phase shift network 171, the output of which forms one input to the mixer 21. The other output of the RF splitter 15 is coupled to the adjustable phase shift network 17, the output of which forms the second input to mixer 21. The delay introduced by the coaxial delay line 19 is nominally 70 nanoseconds; adjustable phase shift network 171 compensates for any frequency sensitivity of the coaxial delay line 19. Both adjustable phase shift networks 17, 171 are comprised of a number of identical stages utilizing digitally controlled pin diodes to vary the amount of phase shift in the introduced into the circuit. Phase shift network 171 comprises a two-bit phase shifter and phase shift netwok 17 comprises a three bit phase shifter. The mixer 21 compares the frequency of the two input signals and provides an output voltage proportional to the frequency difference between the two input signals. When the frequency of the two input signals is the same the mixer output voltage is zero volts and the mixer is said to be at quadrature. If the frequency at the input of the power amplifier 131 changes the coaxial delay line 19 changes the phase relationship between the signals at the two mixer 21 inputs and the mixer output will change from zero volts. For a time delay of TAU there is 360 degrees phase shift at the mixer 21 when the frequency at the input of the power amplifier 131 changes by one/TAU. The nominal sensitivity of the delay line discriminator 13 is 3 mHz/volt; however, the sensitivity has a total variation of 2:1 around the nominal sensitivity over the frequency range of the VCO 1. The output of the delay line discriminator 13 is one input to the low noise amplifier 35.

The second input to the low noise amplifier 35 is provided by the FLL DAC 39 and cancels any DC offset from the mixer 21 and FM path. The FLL DAC 39 is a ten-bit DAC which receives its input on line 36 from the VCO controller RAM 29. Also summed in with the signal provided by FLL DAC 39 at summer 37 is an FM gain compensation signal, FM Kd, to compensate for the FM response of the delay line discriminator 13. The low noise amplifier 35 comprises a dual transistor selected for low noise and low temperature drift. During the fast hop learn mode, the output of the low noise amplifier 35 is set to zero by adjusting the phase shift of adjustable phase shift network 17 and the FLL Kd signal provided by FLL DAC 39 to achieve a zero output when the frequency of the FLL is at the desired frequency value. The phase noise of the FLL is typically set by equal contributions from the mixer 21 and the FLL DAC 39. The output sensitivity of the low noise amplifier 35 varies from 50 kHz/volt to 100 kHz/volt over the frequency range of the VCO 1.

The FLL loop gain compensation signal, Kd, compensates for the changing sensitivity of the delay line discriminator 13. Changes in sensitivity of the delay line discriminator 13 are due to several causes: RF power changes with frequency, RF attenuation changes of the coaxial delay line 19 and phase shift networks 17, 171 with frequency and conversion loss changes of the mixer 21 with frequency. The FLL gain compensation circuit 38 operates equivalent to the performance of a two-bit DAC. The FLL loop gain compensation circuit 38 sets the FLL loop gain and bandwidth to within plus or minus 1 dB over the frequency range of the VCO 1. The sensitivity of the PLL sum signal and the external discriminator signal on lines 42 and 44 respectively are also set by the FLL loop gain compensation circuit 38.

Sum amplifier 41 comprises a discrete operational amplifier, a 35 kHz passive low pass circuit and an active integrator. The output of the summing amplifier 41 is coupled to the loop gain compensation circuit 9. When the FLL is not being utilized line 46 is shorted to ground to remove any unnecessary noise and offset voltage from the PLL VCO drive signal.

An external discriminator input port (not shown) sums into the VCO control circuitry at two points. The out of band signal is directly summed into the loop gain compensation circuitry 9 on line 48. The in-band signal is coupled through a sinx/x compensation circuit (not shown) to the summing amplifier 41 on line 44. The sinx/x compensation circuit cancels out the frequency response of the internal delay line discriminator 13. When the external discriminator is not being used, the external discriminator input port may be left open or shorted to ground.

The VCO error signal from the PLL 10 is coupled to the PLL shaping amplifier 43 on line 50. The gain of the PLL shaping circuit 43 is typically unity, but for certain configurations as dictated by front panel inputs on line 12 the PLL shaping circuit 43 can increase the sensitivity of the PLL tune line by 10. Switch 23 is controlled by a signal on line 52 and switches the PLL tune line 54 to the PLL DAC 45 output during the fast hop mode.

The PLL DAC 45 is an eight-bit DAC having a resistor divider (not shown) on an output to convert the DAC output to a bipolar range. The PLL DAC 45 in combination with the analog multiplexer 49 are utilized as a high accuracy voltmeter. The analog multiplexer 49 provides a single output from four input signals: the VCO tune line 4 voltage, the mixer 21 output voltage, the low noise amplifier 35 output voltage and the PLL tune line 54 voltage. The output signal of the analog multiplexer 49 and the PLL DAC output voltage are coupled to comparator 53. The output comparator 53 is coupled to a SAR which uses the PLL DAC 45 to do a binary research of the signal voltage. When the binary search is completed the output voltage of the PLL DAC 45 is the same as the selected analog multiplexer 49 input signal voltage. The measured signal voltage is then coupled to analog-to-digital convertor 55 which outputs a digital value on line 56 proportional to the measured signal voltage to be stored in the VCO controller RAM 29. Loop gain compensation circuitry 9 comprises a five-bit monotonic DAC having 0.25 dB steps and greater than 10 mHz bandwidth. The gain sensitivity of the VCO 1 tune line 4 typically varies from 12 to 45 mHz/volt over the VCO 1 frequency range. The loop gain compensation circuit 9 attenuates the sensitivity to constant 9.9 mHz/volt over the VCO frequency range. The DAC comprises two switched resistor divider networks having a range of 0 to 7.75 dB in 0.25 dB steps. A resistor network (not shown) forms a input network which assigns different gain sensitivity values to the different analog inputs on lines 46, 48, 54 and 58. These different gain sensitivities set the loop bandwidths of the PLL 10, FLL and the external discriminator (not shown). The FM gain compensation signal FM Kv, sets the FM deviation gain.

In the calibration mode three sets of frequency dependent calibration data are learned by the processor 11. The first set of data is the twelve-bit pretune DAC 31 value for the VCO 1. The correct pretune value for each frequency setting is determined by setting the fractional-N divide number for the desired PLL locked frequency and adjusting the output of the pretune DAC 31 until the voltage on tune line 4 is as close to zero volts as possible (as measured by the voltmeter formed by the PLL DAC 45 and the analog multiplexer 49).

The second set of data is the five-bit loop gain compensation value, Kv, for the VCO 1. For each one mHz step from 505 to 1040 mHz, a loop gain compensation value is determined and saved. Kv is calculated by decrementing the VCO center frequency by 5 mHz and placing a 1.5 volt offset level at the FM input port. The Kv bits are then incremented in a binary search for the proper Kv value. When the Kv value is at the correct value, the voltage on the PLL drive line 54 will be at the same level as the before both of the changes (measured by the voltmeter).

The third set of calibration data is the discriminator gain compensation, Kd. The proper Kd compensation value is determined by zeroing the output voltage of the noise amplifier 35 with the adjustable phase shift network 17 and the FLL DAC 39. The frequency is then decremented by 500 kHz and a 1.5 volt offset is applied to the FM input port. Next the Kd bits are incremented in a binary search to adjust the output voltage of the low noise amplifier 35 as close as possible to the same level as before both of the changes (is measured by the voltmeter).

In order to provide a output which hops from frequency to frequency, the processor 11 must first learn the tune line voltages required for each frequency desired. Three sets of digital data for each desired frequency are determined and stored in a fast hop RAM (not shown) included in the VCO controller RAM 29. First the PLL set to a desired center frequency with the pretune, Kv and Kd data from the VCO controller RAM 29 determined during the calibration phase. The synthesized RF frequency provides a stable frequency for the calibration of the FLL. Once the PLL is locked the voltage on the tune line is measured by the voltmeter. If the ground offset is too high, the pretune DAC value is modified to cancel the tune line offset.

The mixer 21 is then set to quadrature utilizing the digital phase shift network 17, 171. After zero output of the mixture 21 is obtained, the remaining offset voltage of the mixture 21 is measured by the voltmeter. This offset voltage value is then used to compensate the low noise amplifier 35 output offset by adjusting the FLL DAC 39 output. The output of the low noise amplifier 35 is measured by the voltmeter and then adjusted to zero volts by adjusting the output of the FLL DAC 39.

The configuration of the PLL shaping circuit 43 is now reset to increase the sensitivity of the PLL drive line 54. The resulting voltage change on the PLL driee line 54 is measured by the voltmeter and compensated for by adjusting the output of the PLL DAC 45.

The fast hop data thus determined for this frequency is stored in the VCO controller RAM 29 and the process repeated for the next desired frequency. During fast hop operation, the data stored in the VCO controller RAM 29 is cycled in a previously stored selectable sequence as dictated by front panel inputs on line 12 or by real time binary inputs at external input port 24.

To operate in the fast hop mode, each desired frequency and the desired signal amplitude at that frequency is entered in a Channel Table through the front panel input lines 12. The order in which each channel is to be output is then entered in a Sequence Table through the front panel input lines 12. Both the Channel Table and the Sequence Table are stored in the VCO controller RAM 29. The maximum number of channels which can be set is 2400. The maximum number of channels in the hop sequence is 4000. The hop rate may be adjusted between 10 Hz and 50 kHz using an internal timer (not shown). The dwell time for each channel can be adjusted from 6.4 microseconds to 99 milliseconds using the internal timer. Both the hop rate and the dwell time ranges may be extended using direct control via external in port 24 on the instrument rear panel.

We claim:

1. A frequency-locked loop signal generator for generating an output signal having a controllably selectable frequency, comprising:

voltage controlled oscillator means for generating an output signal having a frequency that is controllably variable over a predetermined frequency range;

delay line voltage discriminator means coupled to the output of said voltage controlled oscillator means for detecting a change in the frequency of said output signal and providing an error signal having a magnitude representing said frequency change, said error signal being coupled to said voltage controlled oscillator means to controllably vary the frequency of said output signal so as to reduce said frequency change;

pretune means coupled to said voltage controlled oscillator means for providing a pretune signal, said voltage controlled oscillator means responsive to said pretune signal; memory means coupled to said pretune means for storing pretune information indicative of the value of said pretune signal required by said voltage controlled oscillator means to generate each output signal frequency in said predetermined frequency range; and control means responsive to input information for generating a frequency select signal indicating the selected output frequency and for supplying the pretune information corresponding to said selected output frequency to said pretune means.

2. A frequency-locked loop signal generator as in claim 1 further comprising loop gain compensation means coupled to said delay line discriminator means and to said voltage controlled oscillator means for amplifying said error signal by a selected first gain factor which varies according to the frequency of said output signal to controllably adjust said output signal frequency, said first gain factor selected such that said frequency-locked loop has a substantially uniform gain over said predetermined frequency range, said memory means coupled to said loop gain compensation means and storing information representative of the desired first gain factor for each output signal frequency in said predetermined frequency range, said frequency select signal further supplying first gain factor information corresponding to said selected output frequency.

3. A frequency-locked loop signal generator as in claim 2 further comprising a low noise amplifier coupled to said delay line discriminator for amplifying said error signal by a selected second gain factor which varies according to the frequency of said output signal, said second gain factor compensating for any frequency dependent characteristics of said delay line discriminator means such that said frequency-locked loop has a substantially uniform gain over said predetermined frequency range, said memory means coupled to said low noise amplifier and storing information representative of the required second gain factor for each output signal frequency in said predetermined frequency range, said frequency select signal further supplying second gain factor information corresponding to said selected output frequency.

4. A frequency-locked loop signal generator as in claim 3 further comprising means for coupling a predetermined group of tuning signals to said frequency-locked loop in a selectable sequence to controllably adjust the frequency of said output signal such that said output signal will switch from a desired frequency to a next desired frequency according to said selectable sequence, each of said tuning signals in said predetermined group corresponding to a difference desired frequency.

5. A method of generating an output signal wherein the frequency of said output signal is switched between a plurality of output signal frequencies in a selectable sequence, said method comprising the steps of:
generating an output signal having a selected frequency said selected frequency being one of said plurality of output signal frequencies;
providing an error signal indicative of any change in said frequency to controllably vary said frequency so as to reduce said frequency change;
storing pretune information in a memory means, said pretune information indicative of a plurality of pretune signal values, each of said pretune signal values corresponding to a different one of said plurality of output signal frequencies
determining and storing in said memory means gain information indicative of a plurality of gain signal values, each of said gain signal values corresponding to a different one of said plurality of output signal frequencies; and
utilizing one of said pretune signal values and a corresponding one of said gain signal values in said generating step to effect a switch of said output signal frequency from a selected frequency to a next selected frequency, said output signal frequencies switched in a selectable sequence.

* * * * *

UNITED STATES PATENT AND TRADEMARK OFFICE
CERTIFICATE OF CORRECTION

PATENT NO. : 4,792,768

DATED : December 20, 1988

INVENTOR(S) : Raymond L. Fried and David M. Hoover

It is certified that error appears in the above-identified patent and that said Letters Patent is hereby corrected as shown below:

Column 1, line 65, delete "provide", insert --provides--.

Column 3, line 26, delete "Fout", insert --$F_{out}$--.

Column 3, line 60, delete "2!", insert --21--.

Column 4, line 63, delete "fas", insert --fast--.

Column 7, line 68, delete "driee", insert --drive--.

Signed and Sealed this

Nineteenth Day of December, 1989

Attest:

JEFFREY M. SAMUELS

Attesting Officer    Acting Commissioner of Patents and Trademarks